United States Patent [19]

Ackerman et al.

[11] Patent Number: 5,023,881
[45] Date of Patent: Jun. 11, 1991

[54] PHOTONICS MODULE AND ALIGNMENT METHOD

[75] Inventors: David A. Ackerman, Hopewell; Greg E. Blonder, Summit; William M. Mac Donald, Stockton, all of N.J.

[73] Assignee: AT&T Bell Laboratories, Murray Hill, N.J.

[21] Appl. No.: 540,044

[22] Filed: Jun. 19, 1990

[51] Int. Cl.[5] ................................................ H01S 3/19
[52] U.S. Cl. ...................................... 372/46; 372/43; 372/50
[58] Field of Search .................. 350/96.11; 372/36, 34, 372/43, 45, 50

[56] References Cited

U.S. PATENT DOCUMENTS

| 4,156,206 | 5/1979 | Comerford et al. | 331/94.5 |
| 4,464,762 | 8/1984 | Furuya | 372/50 |
| 4,750,799 | 6/1988 | Kawachi et al. | 350/96.11 |
| 4,904,036 | 2/1990 | Blonder | 350/96.11 |

OTHER PUBLICATIONS

"Glass Waveguides on Silicon for Hybrid Optical Packaging," C. H. Henry et al., Journal of Lightwave Technology, vol. 7, No. 10, Oct. 1989, pp. 1530-1539.

Primary Examiner—Léon Scott, Jr.
Attorney, Agent, or Firm—R. B. Anderson

[57] ABSTRACT

A laser (24) is mounted in predetermined alignment with a monocrystalline mounting member (11) by defining in the mounting member a reference surface (18) that is displaced from a second surface (19). Solder (29) is placed on a second surface such that in its solid form its length and width each significantly exceeds its height. The laser is bonded to the reference surface such that part of the laser overlies the solder and is separated from the solder by a small gap (30). Next, the solder is melted to cause it to gather on the second surface sufficiently to contact an under surface (31) of the laser. The solder is then cooled such that the solder bonds the laser to the silicon mounting member.

26 Claims, 3 Drawing Sheets

PHOTONICS MODULE AND ALIGNMENT METHOD

TECHNICAL FIELD

This invention relates to alignment methods and, more particularly, to methods for aligning permanently a photonics device such as a laser with a component of an optical communications system.

BACKGROUND OF THE INVENTION

One of the major advances in recent years has been the increased use of optical communications systems for carrying very large quantities of information with low distortion and at low cost over great distances. Optical systems are also promising for such purposes as computing because of the inherently high speeds at which they can be operated. For these reasons, considerable development work has been done in making various photonics packages for use in such systems. Photonics generally refers to devices that share both electronic and optical attributes, such as lasers, which generate coherent light in response to an electronic signal, and photodetectors, which generate an electrical signal in response to light.

A fundamental problem in making a photonics package such as a laser source module is the alignment of a device such as the laser with an optical waveguide. As pointed out in the paper, "Glass Waveguides on Silicon for Hybrid Optical Packaging," C. H. Henry, G. E. Blonder, and R. F. Kazarinov, *Journal of Lightwave Technology*, Vol. 7, No. 10, October 1989, pp. 1530-1539, hereby incorporated herein by reference, monocrystalline silicon is a good choice of material for making such modules. The advantages of silicon derive basically from its extensive use in the integrated circuit technology; known processing techniques can be used for making in monocrystalline silicon various structures with various electrical properties and with a high degree of accuracy. For example, photolithographic masking and etching can routinely be used for producing device features with sub-micron tolerances. The paper describes a method for taking advantage of these attributes to make waveguides on the surface of silicon substrates that can be accurately aligned with other photonics elements mounted on the substrate.

In spite of continuing advances such as those represented by the Henry et al. paper, the problem of making low cost laser modules containing semiconductor lasers in accurate registration with output optical waveguides in a manner that permits their long term use has continued to be troublesome. Semiconductor lasers are typically made of a semiconductor compound material such as indium phosphide which is structually more fragile than silicon. Further, one must often provide a thermal path from the laser for appropriate heat sinking to avoid long term damage to the device. There is therefore a continuing need for production methods for making photonics modules that meet such diverse requirements and yet are amenable to mass production without requiring a high degree of operator skill.

SUMMARY OF THE INVENTION

In accordance with an illustrative embodiment of the invention, a first member, such as a laser, is mounted in predetermined alignment with a second member, such as a monocrystalline silicon mounting member, by first defining in the mounting member a reference surface that is displaced from a second surface upon which a quantity of solder is placed. The laser is contacted to the reference surface of the silicon mounting member such that part of the laser overlies the solder, is separated from the second surface by a first gap, and is separated from the solder by a small second gap. Next, the solder is melted to cause it to gather on the second surface sufficiently to contact an under surface of the laser. The solder is then cooled such that the first gap remains constant and solder bonds the laser to the silicon mounting member.

The silicon mounting member is made with its reference surface to be in precise registration with an optical waveguide that is provided on one surface of the silicon mounting member. As a consequence, as long as the laser is firmly held on the reference surface, and the first gap remains constant, the laser can be made to be in alignment with the optical waveguide. Preferably, the laser is tacked by a textured cold weld to the reference surface to hold it in place as the solder is melted and thereafter cooled to form the bond to the laser. After the solder bond has been made, the solder constitutes a relatively massive heat conductor for the laser, which is useful in preventing damage to the laser during its subsequent operation. The tacking can be done while avoiding a large stress on the fragile semiconductor, such as that accompanying a conventional compression weld, and therefore does not constitute a significant damage risk.

As will be explained more fully later, the reference surface is preferably made to have an array of triangular projections which are metallized. A metallized surface of the laser is brought into contact with it so as to make a textured cold weld in a manner described in the copending application of Blonder and Fulton, Ser. No. 222,465 filed Jul. 21, 1988, which is hereby incorporated by reference herein. The triangular projections can be made by photolithographic masking and etching with a great deal of accuracy, and the bond can be made such that the laser is precisely registered with respect to the reference surface.

In a preferred embodiment, two reference surfaces are defined on the top surfaces of pedestals of the silicon mounting member. The laser is then texture cold welded to the top reference surfaces of the two pedestals such as to bridge the solder contained between them. When the solder makes contact with the underside of the laser and hardens, it can be appreciated that the laser is securely supported in a manner that will maintain alignment even if subjected to the rigors of somewhat rough handling.

These and other objects, features and benefits of the invention will be better understood from a consideration of the following detailed description taken in conjunction with the accompanying drawing.

DETAILED DESCRIPTION

The drawings and description are greatly simplified in an effort to describe clearly the nature of the invention. The illustrations are not drawn to scale and, indeed, are intentionally distorted to reveal more clearly certain salient features thereof.

Figure 1:
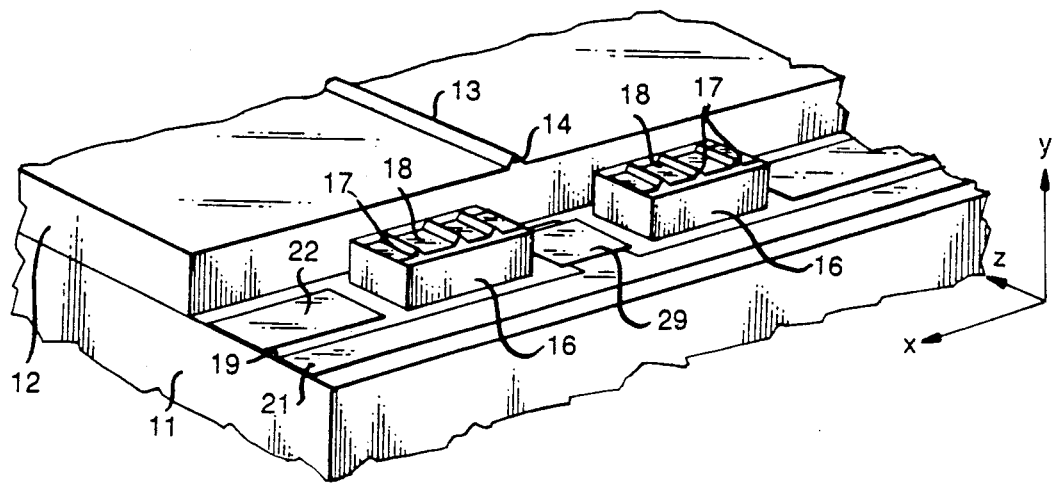
FIG. 1 is a perspective schematic view of a silicon mounting member to be used as part of a laser source module in accordance with an illustrative embodiment of the invention.

Referring now to FIG. 1, there is shown schematically a portion of a monocrystalline silicon mounting member 11 upon which it is desired to mount a laser as part of a laser source module in accordance with an illustrative embodiment of the invention. Included on one surface of the silicon member 11 is an oxide layer 12 having defined within it, upon an upper surface, an optical waveguide 13. As is described in the aforementioned Henry et al. article, the waveguide 13 may comprise a waveguide core 14 of six percent phosphorous glass having a height of about five microns, covered with two percent phosphorous glass having a height of another five microns. The thickness of the oxide 12 may be on the order of fifteen microns.

Located adjacent the oxide layer 12 are a pair of pedestals 16 extending from the silicon body 11. Formed on the upper surfaces of the pedestals are a plurality of triangular projections 17, which will be used to tack or to temporarily mount a laser. The upper surfaces of the pedestals are metallized with a thin metal layer 18, which will constitute reference surfaces for mounting the laser as will be explained later. A second surface 19 of the silicon mounting member 11 is displaced from the upper surfaces of the pedestals and contains metallization layers 21 and 22. The silicon surface is preferably oxidized prior to the metallization to provide electrical insulation to the metallization layers as is well-known in the art. Metallization layer 21 constitutes a lead for supplying an electrical voltage to the p-conductivity side of a semiconductor laser, while metallization 22 supplies a voltage to the n-conductivity side of the laser.

Figure 2:
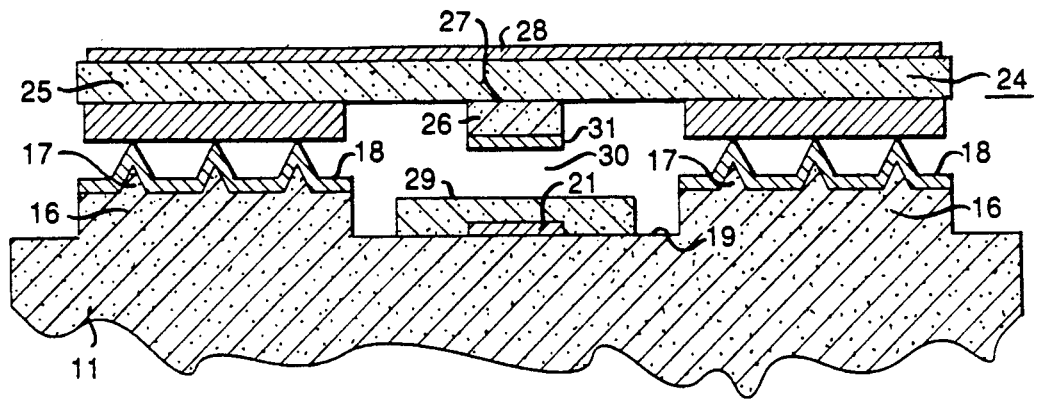
FIG. 2 is a schematic sectional view of a laser and the silicon mounting member of FIG. 1.

Referring to FIG. 2, there is shown a sectional view of the silicon mounting member 11 containing pedestals 16, upon which it is desired to mount a semiconductor laser 24. The laser 24 has a n-conductivity portion 25 and a p-conductivity portion 26, which define between them a semiconductor junction 27, which is capable of emitting coherent light in accordance with known semiconductor laser principles. Various other semiconductor layers may typically be used in the device, in accordance with known laser device principles, which for brevity and simplicity will not be shown or described. The purpose of the silicon mounting member is to mount and contain the laser 24 such that the junction 27 is in alignment with the optical waveguide 13 of FIG. 1. A metallization layer 28 constitutes a contact to the n-conductivity portion 25.

Overlying a portion of the metallization 21 on the second surface 19 of silicon member 11 is a plating of solder 29 having length and width dimensions that are significantly greater than its height. Its height is such that there is a discernable gap 30 between the solder layer and the underside of the laser. A portion of the underside of the laser opposite the solder is metallized to form a metal layer 31. The solder 29 may be vapor deposited or electron beam deposited onto the second surface 19, both methods being well known in the art, which for brevity will not be explained. A portion of the solder lies on the metallized layer 21 and part on the oxidized silicon portion of second surface 19.

Figure 3:
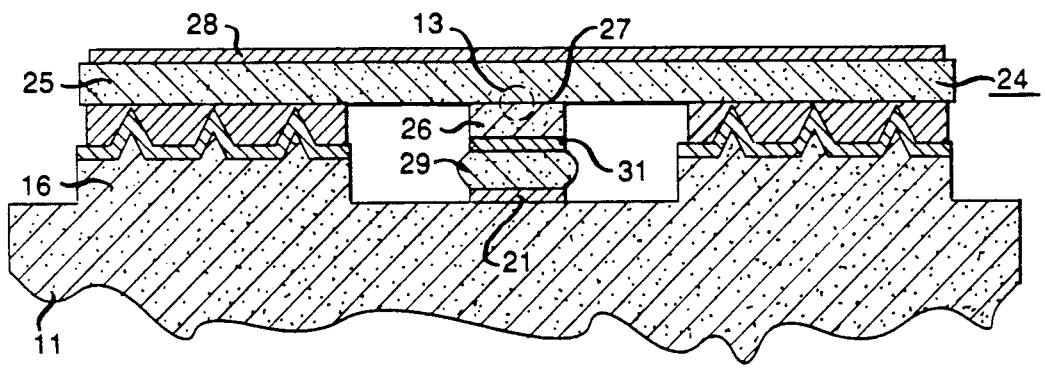
FIG. 3 is a view of the apparatus of FIG. 2 at a subsequent stage of fabrication.

The metallized surfaces of the laser resting on the triangular projections 17 of pedestals 16 permit the laser to be bonded by textured cold welding to the silicon member 11. Although the semiconductor laser 24 is typically made of a relatively fragile material such as indium phosphide, the size and density of triangular projections 17 are small enough to permit a textured cold weld with a relatively small applied force. Thus, the laser is tacked to the silicon mounting member 11 by exerting a downward force on the laser to abut it firmly against the reference surfaces 18 along the top of pedestals 16 as shown in FIG. 3. Textured cold welds operate on the principle that sharp projections greatly concentrate forces transmitted to abutting objects. Thus, the metallized surfaces produce high concentrations of forces at the tips of projections 17 even though the actual pressure in pounds per unit of area exerted on the laser may be quite small; at least small enough to avoid damage to the laser. This concentration of force is sufficient to make a small localized cold weld at the tip of each projection 17 as in accordance with the aforementioned patent application of Blonder et al.

After the textured cold welds have been made, the apparatus is heated to melt the solder layer 29. It is characteristic of virtually all solders that in its molten form, being quite dense, it forms a significant meniscus due to surface tension. Another characteristic of most solder is that is does not wet well to oxidized silicon but does wet quite well to most metals. Thus, when solder 29 is melted, it tends to gather and withdraw or "dewet" from the oxidized silicon surface 19. In accordance with the invention, the gap 30 is made sufficiently small that after the molten solder gathers, it contact the metallized surface 31 as shown in FIG. 3. The textured cold weld or tacking of the laser prevents it from moving during this process, and after the solder cools the laser is securely bonded to the silicon mounting member 11. Another advantage of this method of solder bonding is that it inherently results in a relatively massive solder connection 29 between the laser and the silicon member. As such, the globular solder mass 29 constitutes an effective heat conductor for removing heat that is generated during operation at junction 27 of the laser 24.

The height of reference surfaces 18 at the top of pedestals 16 is carefully and precisely chosen with respect to the dimensions of the laser 24 such that, after the cold weld tacking, the junction 27 of the laser is aligned with the waveguide 13 of FIG. 1. This intended alignment is represented in FIG. 3 by the phantom designation of waveguide 13 such that its core is aligned with junction 27. Since the pedestals 16 are monocrystalline silicon, the triangular projections 17 can be made with extremely high tolerances by the known process of photolithographic masking and etching. The etching is anisotropic and can be done, or is known in the art, such that crystallographic planes define the sides of the triangular projections 17. It is quite straightforward thereafter to etch away the silicon substrate 11 so as to define the pedestals 16. Likewise, the deposition of oxide layer 12 can be accomplished with a great deal of precision, and the formation of the waveguide 13 can be made in accordance with the aforementioned C. H. Henry et al. article so as to give a precisely predetermined vertical separation between the waveguide 13 and the reference surfaces 18. The thickness of the laser 24 is made with great accuracy by known semiconductive fabricating techniques such that, after tacking, junction 27 is a predetermined distance above the surface 19 and is in precise alignment with the waveguide. Control of the various metallizations is, of course, also important, but these can easily be controlled to within a fraction of a micron by known deposition techniques. The upper surfaces of the pedestals could be oxidized to a greater thickness if so desired; however, as is known, projections 17 cannot as easily be made in the shape described by anisotropic etching since $SiO_2$ is not crystalline. Various known ion milling, etching and other techniques can be used if it is desired to define the pedestals from an oxide layer.

Illustratively, the height of the pedestals 16 is about five microns, the width of laser 24 is five hundred eight microns, the thickness of the p-conductivity portion 26 of the laser is three microns, and the thickness of the n-type conductivity portion 25 of the laser is ninety microns. The width of solder member 29 before melting may be approximately one hundred fifty microns and after gathering as shown in FIG. 3, that dimension may be reduced to about seventy-five microns.

Figure 4:
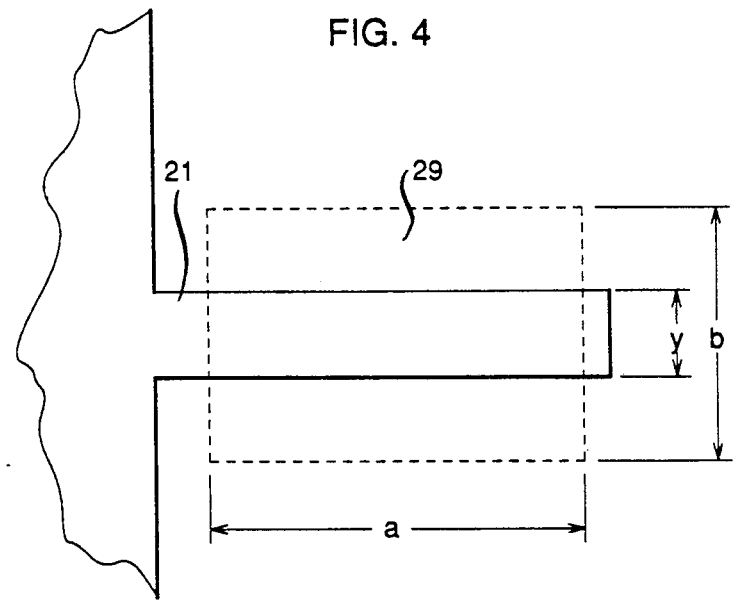
FIG. 4 is a schematic view of part of the metallization of the apparatus of FIGS. 1 and 2.
Figure 5:
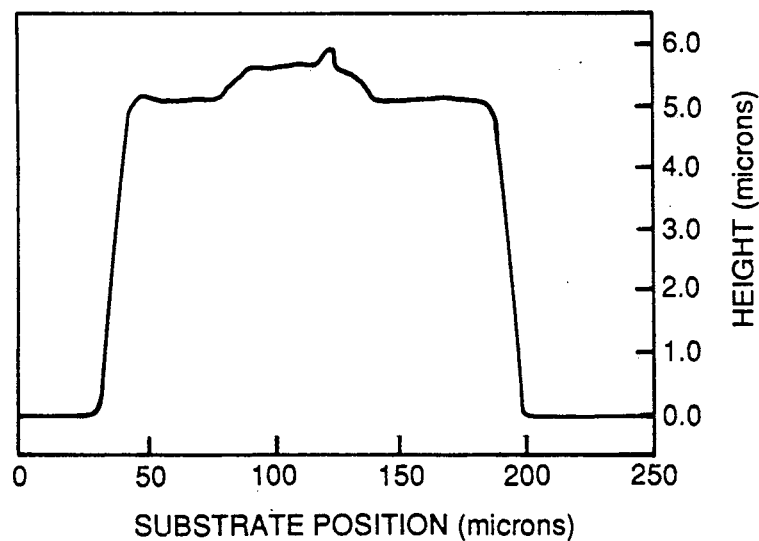
FIG. 5 is a graph of solder position versus height in the apparatus of FIGS. 1 and 2.
Figure 6:
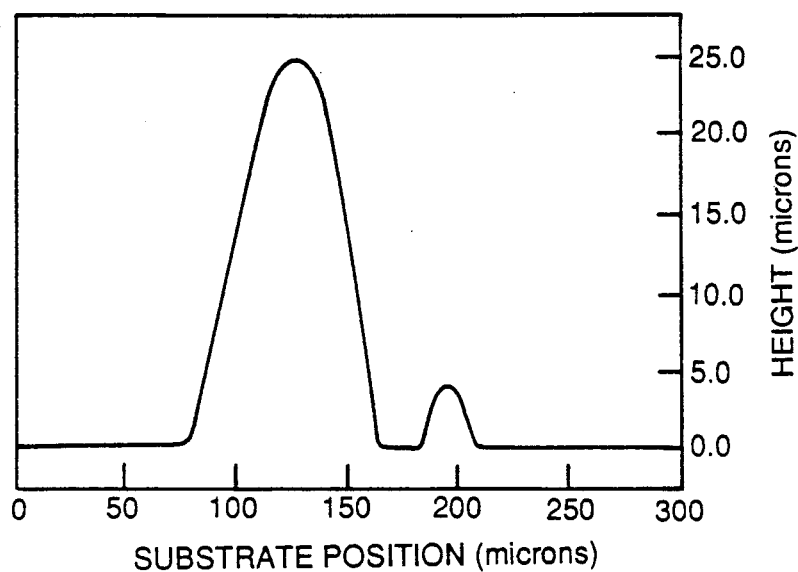
FIG. 6 is a graph of solder position versus height after solder has gathered in the fabrication step illustrated in FIG. 3.

FIG. 4 shows a top view of the metallization 21 and the solder 29 prior to melting. The metallization 21 may have a width y of fifty microns while the solder may have a length a of two hundred fifty microns and an initial width b of one hundred fifty microns. FIGS. 5 and 6 illustrate the gathering phenomenon of the solder 29 without the laser 24 in place. The curve of FIG. 5 illustrates the height of the solder and the dimension b of the solder in microns prior to melting. Thus, prior to melting the solder had a dimension b of about one hundred fifty microns and a height of five microns. As shown in FIG. 6, the globular solder after gathering had a width b of about seventy-five microns and a height of about twenty-five microns. This indicates an approximately five-fold increase in the height of the solder during gathering, which is more than sufficient to fill an appropriately sized gap 30 as shown in FIG. 2.

Figure 7:
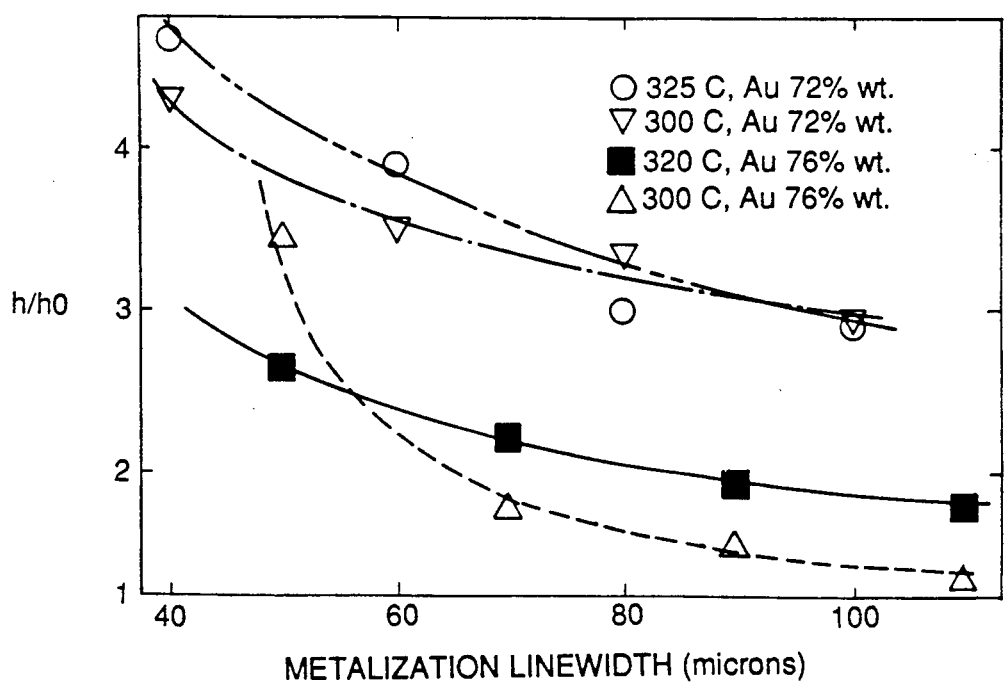
FIG. 7 is a graph showing height versus metallization line width for various solder bonds that may be used in accordance with the invention.

FIG. 7 shows the gathering of various solder samples of different solder composition with different linewidths of the metallization layer 21 and at different melting temperatures. The ordinate is the ratio of height h after gathering to height h0 before gathering. The samples designated by a circle were seventy-two percent by weight of gold, twenty-eight percent by weight of tin, and were melted at 325° C. It can be seen that in general, a small metallization linewidth y such as forty microns gives more extensive gathering than a linewidth of one hundred microns. Thus, there is approximately a five-fold increase in solder height with a linewidth y of forty microns, but only a three-fold increase in height with a one hundred micron linewidth.

The inverted triangular samples were of the same composition as those designated by a circle but were heated only to 300° C. The samples designated by a solid square were seventy-six percent by weight of gold, twenty-four percent by weight of tin and were melted at 320° C. The samples designated by a regular triangle were seventy-six percent by weight of gold, twenty-four percent by weight of tin and heated at 300° C. Thus, one can see that a higher temperature normally causes more gathering than a lower temperature under the same circumstances and seventy-two percent by weight of gold results in more gathering than samples with seventy-six percent by weight of gold. After the solder gathers, it wets well to the metallizations 21 and 31 which it contacts, and thereby can be made to constitute a reliable bond.

The textured cold welding is intended merely to tack the laser in place during the subsequent solder operation. The density of the projections 17 used was quite low; only six for each pedestal. As described in the aforementioned Blonder et al. application, the projections 17 should have a feature size of between 0.1 and ten microns. Illustratively, each projection has a height of five microns and is made by selective etching along crystallographic planes of the silicon mounting member 11. The various metallizations including the metallizations over the projections are preferably a known sandwich of titanium, platinum and gold, with gold being on the upper surface. The dependable textured cold welds can then be made by exerting a force of only about thirty-five grams on the upper surface of the laser opposite the pedestals. This force is insufficient to damage the laser which may typically be of indium phosphide. It can be appreciated that the tacking need be sufficient only to define a gap between the laser and second surface 19 which is held constant throughout the process; that is, the solder bonding does not affect the vertical position of the laser.

The solder 29 was heated by using heat pulses to raise sample temperatures to between 300° C. and 400° C. for time durations of from five to thirty seconds. The heating was carried out under a forming gas ambient of fifteen percent $H_2$. Even though the textured cold weld bond is not by itself very strong, with the soldered joint as reinforcement, it can be expected to maintain its integrity during use. After the assembly as described, the contact 28 of n-conductivity type portion 25 of the laser 13 was wire bonded to the metallization contact 22 of FIG. 1; such boding is well known in the art. The solder, of course, interconnects the p-conductivity portion 26 of the laser to metallization 21 of FIG. 1, and an appropriate applied voltage causes the laser to emit light that is transmitted by optical waveguide 13. As is known, an n-conductivity portion extending to the underside of the laser could be made if so desired; in such case a second solder bond, similar to solder 29, could be made to such n-portion in place of the wire bond.

From the forgoing, one can appreciate that we have described a method for accurately aligning a semiconductor laser junction with an optical waveguide. While we prefer to texture cold weld the laser to the reference surface 18, such welding would not be necessary if some other method were devised for holding the laser in place during the soldering operation. We have found that the gathering of the solder can be accentuated by the use of a metallization 21 of the proper width, but such metallization is not essential for a gathering phenomenon to take place. Likewise, all of the solder 29 may be located on a metal film 21 and gathering or balling up will still inherently take place when the solder film is melted. Deposition of the solder such that its length and width greatly exceed its height also enhances gathering but is not essential. Any of various methods for depositing the solder may be used such as to take advantage of a subsequent gathering or balling up condition. Our invention exploits the silicon technology and the waveguide forming technology of the Henry et al. paper, but, in principle, the optical waveguide could be a conventional optical fiber or other light guide element and the mounting member 11 could be of any various other materials other than silicon. The silicon is preferably oxidized but the metal and solder layers may be made on bare silicon if desired. The device that is aligned could be a device other than a laser such as a photodetector, a lens, or any device for which alignment is important. It can be appreciated that the apparatus made by the described method holds a device in accurate alignment with an optical waveguide or other structure even under conditions of rigorous use. The globular solder constitutes a convenient heat conductor as well as an alignment tool.

We claim:

1. A method for making an optical module containing a first optical device in predetermined alignment with a second optical device comprising the steps of:
   supporting the first optical device on a first member;
   supporting the second optical device on a second member;
   depositing solder on a second surface of the second member;
   aligning the first and second optical devices;
   the aligning step comprising the step of abutting first surfaces of the first and second members;
   the abutting step comprising the step of causing a third surface of the first member to overhang at least part of the solder and to be separated from the solder by a gap;
   melting the solder to cause it to gather to an extent sufficient to contact the overhanging portion of the first member and to fill at least part of the gap;
   and cooling to solidify the solder while maintaining said abutment, whereby the first and second members are permanently bonded together with the first and second devices in predetermined alignment.

2. The method of claim 1 further comprising the steps of:
   prior to the solder depositing step, metallizing at least part of the second surface of the second member and at least part of the third surface of the first member;
   and depositing the solder such that its length and width each significantly exceeds its height.

3. The method of claim 1 wherein:
   the second member includes on a first surface at least one first bonding pad and the second member comprises at least one second bonding pad;
   and further comprising the step of texturing at least one of the first and second bonding pads, the texturing comprising features having a height of between 0.1 and ten microns;
   and wherein the contacting step comprises the step of pressing together the first and second bonding pads with a sufficient force to cause them to bond.

4. The method of claim 3 further comprising the steps of:
   at least partially metallizing the second surface of the second member and the surface of the first member prior to the first deposition step, whereby the solder bonds to metallized surfaces of the first and second members.

5. The method of claim 4 wherein:
   the step of depositing solder on the first surface comprises depositing the solder such that in its solid form it covers more area than the metallized surface portion, thereby to accentuate the gathering of the solder on the metal surface portion during the melting step.

6. The method of claim 1 wherein:
   the first and second optical devices are devices selected from the group consisting of lasers, photodetectors, lenses and optical waveguides.

7. The method of claim 2 wherein:
   the second optical device is an optical waveguide formed in an upper surface of the second member, and the first optical device is a laser.

8. The method of claim 3 wherein:
   the first member is made of a semiconductor material and the laser is a semiconductor laser formed in the second member.

9. The method of claim 1 wherein:
   the second member is made of monocrystalline silicon;
   and the first and second surfaces of the second member are formed in the second member by masking and etching, whereby the locations of the first and second surfaces with respect to the second device of the second member can be made with great precision.

10. A method for mounting a semiconductor laser on a silicon member comprising the steps of:
    masking and etching displaced first surfaces in a silicon member to form therein a plurality of minute projections;
    forming a pair of pedestals on the silicon member each having one of the first surfaces as a top surface, the pedestals separated by a second surface of the silicon member;
    depositing solder on the second surface such that in its solid form it has a thickness that is less than the height of said pedestals;
    metallizing at least part of the projections of the first surfaces;
    metallizing two areas on a surface of a semiconductor laser;
    bridging the laser across the two pedestals such that metallized surfaces of the laser overlies each of the first surfaces of the silicon member, and such that the laser overlies the solder and forms therewith a gap;
    pressing the laser against the projections of the first surfaces of the pedestals such as to form textured cold welds;
    melting the solder to cause it to gather to an extent sufficient to contact the laser;
    and cooling to solidify the solder so as to form a solid solder member interconnecting the laser with the second surface of the silicon member.

11. The method of claim 10 wherein:
    part of the second surface of the silicon member is metallized;
    the solder is deposited such that in its solid form part of it lies on a non-metallized surface and part of it lies on a metallized surface, whereby, when the solder is melted, it preferentially gathers on the metallized surface.

12. The method of claim 11 further comprising the step of:
    mounting an optical waveguide on the silicon mounting member so as to be aligned with the laser.

13. The method of claim 10 wherein:
    the projections have a feature size between 0.1 and ten microns.

14. The method of claim 10 further comprising the steps of:

depositing an oxide layer on part of the silicon member;

and forming an optical waveguide on an upper surface of the oxide layer;

and wherein the displaced first surfaces are selected such that after the melting and cooling steps, the laser is aligned with the optical waveguide such that light emitted by the laser may be transmitted by the optical waveguide.

15. The method of claim 14 wherein:

part of the second surface of the silicon member is metallized;

and the solder is deposited such that in its solid form part of it lies on a non-metallized surface and part of it lies on a metallized surface, whereby when the solder is melted it preferentially gathers on the metallized surface.

16. The method of claim 15 wherein:

the projections have a feature size between 0.1 and ten microns.

17. The method of claim 16 wherein:

the laser is predominantly of indium phosphide;

and the pressing step comprises pressing the laser against the projections with a force of about thirty-five grams.

18. The method of claim 16 wherein:

the melting step comprises heating the solder to a temperature significantly above its melting point, thereby to accentuate the gathering of the molten solder.

19. The method of claim 18 wherein:

the solder is about seventy-two percent gold and twenty-eight percent tin.

20. The method of claim 16 wherein:

the projections are formed by photolithographic masking and etching, and the etching is anisotropic and predominantly along crystallographic planes of the silicon member.

21. A photonics module comprising:

a semiconductor member supporting on a first surface thereof a light guide element;

a reference surface of the semiconductor member being precisely located with respect to the light guide element;

a photonics device bonded to the reference surface and having an underside overhanging a second surface of the semiconductor member;

a solder element interconnecting the underside of the photonic element with the second surface of the semiconductor element, the solder element being made by depositing solder on the second surface and then melting it to cause it to gather to an extent sufficient to contact the underside of the photonics device.

22. The photonics module of claim 21 wherein:

the semiconductor member has defined on it two displaced pedestals, each having an upper surface defining a reference surface;

the photonics device is bonded to the reference surfaces of both pedestals;

and the solder element is located between the pedestals.

23. The module of claim 22 wherein:

the photonics device is a semiconductor laser.

24. The photonics module of claim 23 wherein:

an oxide layer is included on the first surface of the semiconductor member;

and the light guide element is an optical waveguide defined in an upper surface of the oxide layer;

the semiconductor laser contains a light emitting junction aligned with said optical waveguide.

25. The photonics module of claim 24 wherein:

the reference surfaces contain texturing having a feature size of between 0.1 and ten microns;

and the reference surfaces are metallized;

and the laser is textured cold welded to the reference surfaces.

26. The module of claim 25 wherein:

the texturing comprises triangular projections each having a height of about five microns.

* * * * *